United States Patent
Komaki et al.

(10) Patent No.: US 10,545,416 B2
(45) Date of Patent: Jan. 28, 2020

(54) DETECTION APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Takamitsu Komaki, Utsunomiya (JP); Takashi Shibayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/270,889

(22) Filed: Feb. 8, 2019

(65) Prior Publication Data

US 2019/0250525 A1    Aug. 15, 2019

(30) Foreign Application Priority Data

Feb. 13, 2018    (JP) .................................. 2018-023405

(51) Int. Cl.
*G03B 27/54*    (2006.01)
*G03F 9/00*    (2006.01)
*G03F 7/00*    (2006.01)

(52) U.S. Cl.
CPC .......... *G03F 9/7088* (2013.01); *G03F 7/0002* (2013.01)

(58) Field of Classification Search
CPC .... G03F 9/7088; G03F 9/7038; G03F 9/7049; G03F 9/7069; G03F 9/7076; G03F 7/0002
See application file for complete search history.

(56) References Cited

U.S. PATENT DOCUMENTS

| | | | | |
|---|---|---|---|---|
| 5,053,628 A | * | 10/1991 | Yamamoto | G03F 9/7049 250/557 |
| 5,481,362 A | * | 1/1996 | Van Den Brink | G03F 9/7049 356/401 |
| 9,283,720 B2 | | 3/2016 | Minoda et al. | |
| 9,946,156 B2 | | 4/2018 | Sato | |
| 2006/0072095 A1 | * | 4/2006 | Kudo | G03B 27/42 355/67 |
| 2017/0307367 A1 | * | 10/2017 | Yaegashi | G01B 11/272 |
| 2018/0196363 A1 | * | 7/2018 | Bijnen et al. | G03F 9/7046 |

FOREIGN PATENT DOCUMENTS

| | | | |
|---|---|---|---|
| JP | 63078004 A | * | 4/1988 |
| JP | H01209721 A | | 8/1989 |
| JP | 4185941 B2 | | 11/2008 |
| JP | 2013030757 A | | 2/2013 |
| JP | 2014203935 A | | 10/2014 |

* cited by examiner

*Primary Examiner* — Peter B Kim
(74) *Attorney, Agent, or Firm* — Rossi, Kimms & McDowell LLP

(57) ABSTRACT

The present invention provides a detection apparatus for detecting a plurality of marks provided on a substrate, comprising: an optical system; an illumination unit configured to selectively illuminate the plurality of marks with a plurality of light beams via the optical system such that each of the plurality of marks is illuminated with at least one light beam; and an image capturing device configured to capture an image of the plurality of marks via the optical system, wherein the illumination unit includes a change unit configured to individually change an incident angle of each of the plurality of light beams on a pupil plane of the optical system, thereby changing an irradiated position of each of the plurality of light beams on the substrate.

22 Claims, 11 Drawing Sheets

FIG. 2
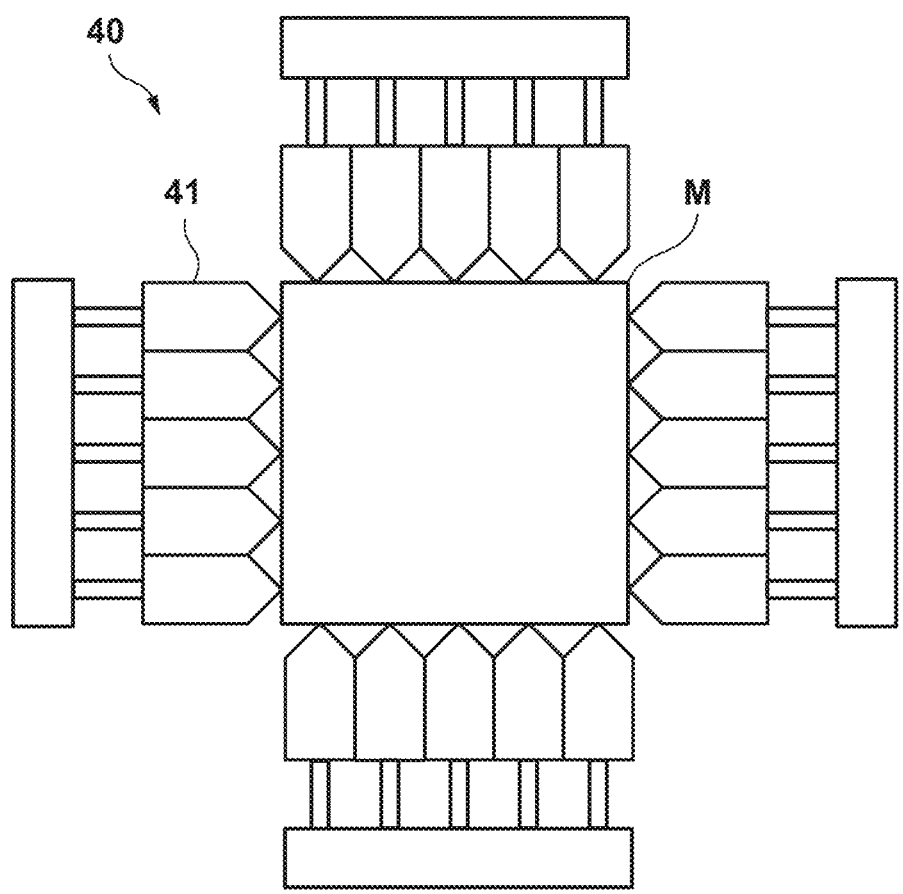
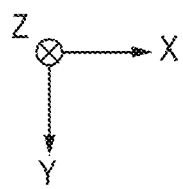

FIG. 3
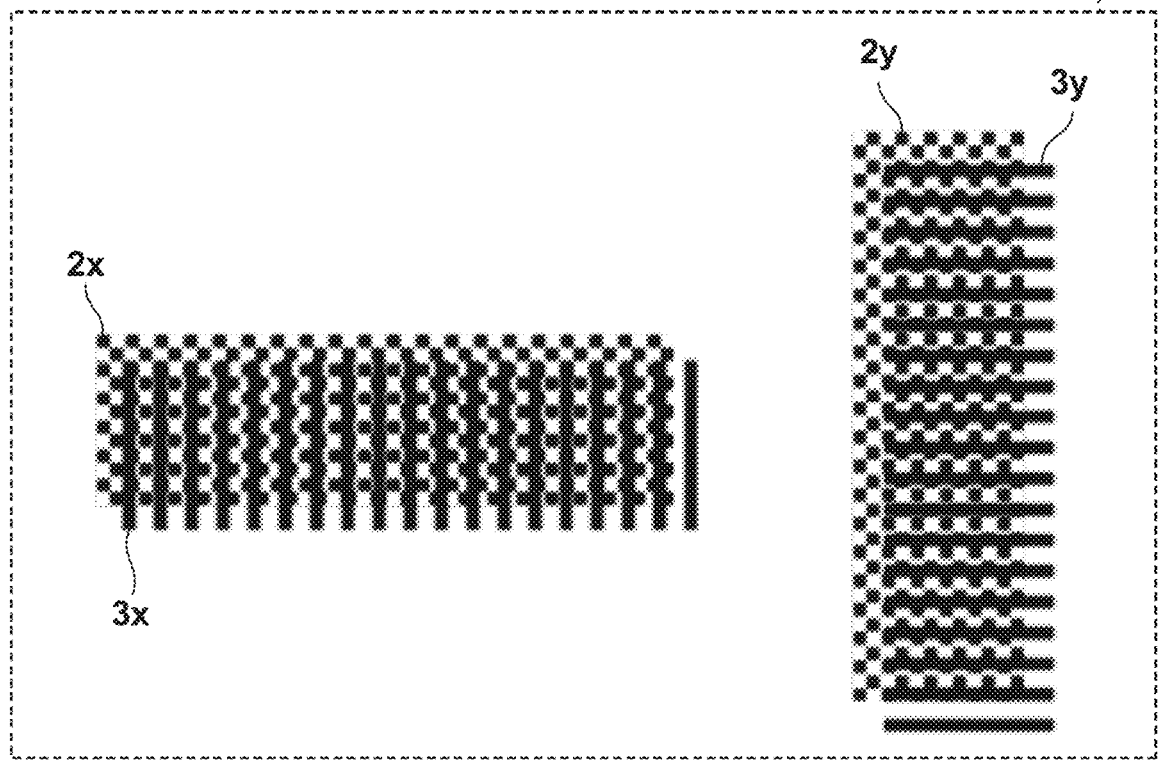
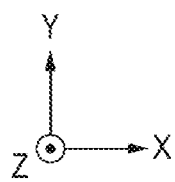
FIG. 4
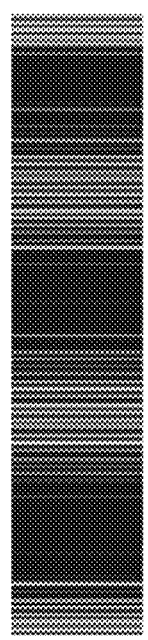

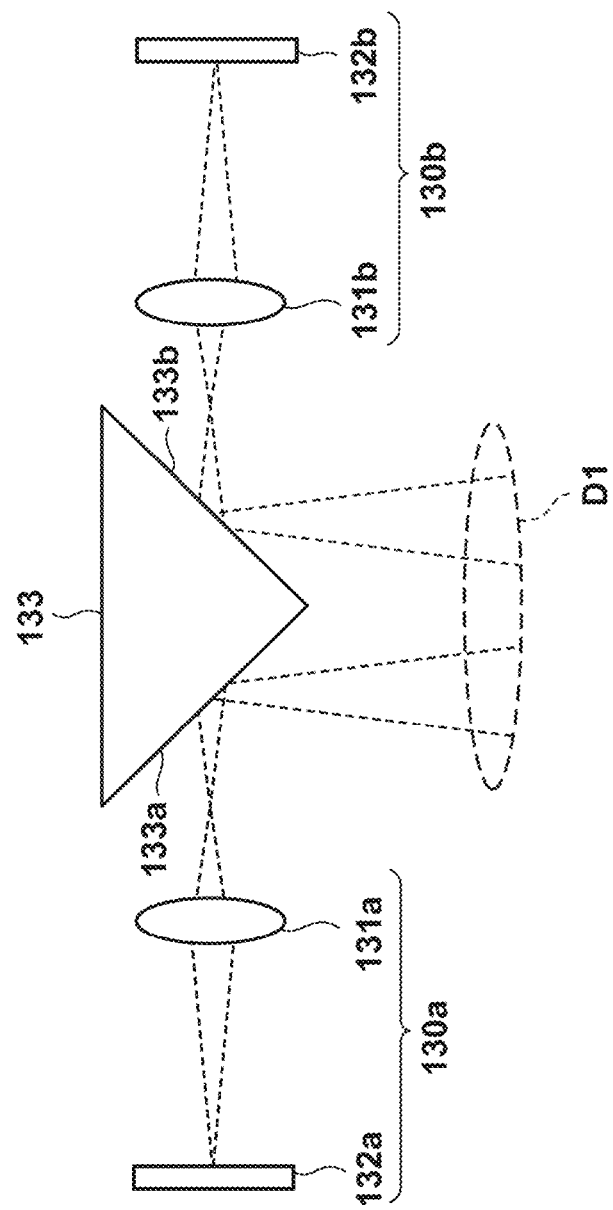

DETECTION APPARATUS, LITHOGRAPHY APPARATUS, AND METHOD OF MANUFACTURING ARTICLE

BACKGROUND OF THE INVENTION

Field of the Invention

The present invention relates to a detection apparatus for detecting a plurality of marks provided on a substrate, a lithography apparatus, and a method of manufacturing an article.

Description of the Related Art

An imprint apparatus configured to form the pattern of an imprint material on a substrate using a mold with an uneven pattern has received attention as one type of lithography apparatus used for mass production of a semiconductor device or the like. To accurately transfer the pattern of the mold to the imprint material on the substrate, the imprint apparatus is required to accurately perform alignment between the mold and the substrate.

An imprint apparatus generally employs a die-by-die alignment method as an alignment method between a mold and a substrate. The die-by-die alignment method is an alignment method of optically detecting the relative positions of a mold-side mark and a substrate-side mark for each shot region of a substrate and correcting the shift of the positional relationship between the mold and the substrate (see Japanese Patent No. 4185941 and Japanese Patent Laid-Open No. 2014-203935).

The imprint apparatus uses a method of capturing an image of an entire shot region of a substrate via a mold and detecting, for each of a plurality of substrate-side marks provided on the shot region, the relative positions of the substrate-side mark and a mold-side mark. In such a detection method, to accurately detect the relative positions of the substrate-side mark and the mold-side mark, it is desirable to selectively illuminate each substrate-side mark (each mold-side mark) and increase the illuminance, instead of illuminating the whole shot region.

SUMMARY OF THE INVENTION

The present invention provides, for example, a technique advantageous in selectively illuminating each of a plurality of marks on a substrate by a simple arrangement.

According to one aspect of the present invention, there is provided a detection apparatus for detecting a plurality of marks provided on a substrate, comprising: an optical system; an illumination unit configured to selectively illuminate the plurality of marks with a plurality of light beams via the optical system such that each of the plurality of marks is illuminated with at least one light beam; and an image capturing device configured to capture an image of the plurality of marks via the optical system, wherein the illumination unit includes a change unit configured to individually change an incident angle of each of the plurality of light beams on a pupil plane of the optical system, thereby changing an irradiated position of each of the plurality of light beams on the substrate.

Further features of the present invention will become apparent from the following description of exemplary embodiments with reference to the attached drawings.

BRIEF DESCRIPTION OF THE DRAWINGS

FIG. 2 is a view showing an example of the arrangement of a mold correction unit;

FIG. 3 is a view showing an example of the arrangement of a substrate-side mark and a mold-side mark;

FIG. 4 is a view showing an interference fringe;

FIG. 11 is a schematic view showing an example of the arrangement of an image capturing device according to the second embodiment.

DESCRIPTION OF THE EMBODIMENTS

Figure 1:
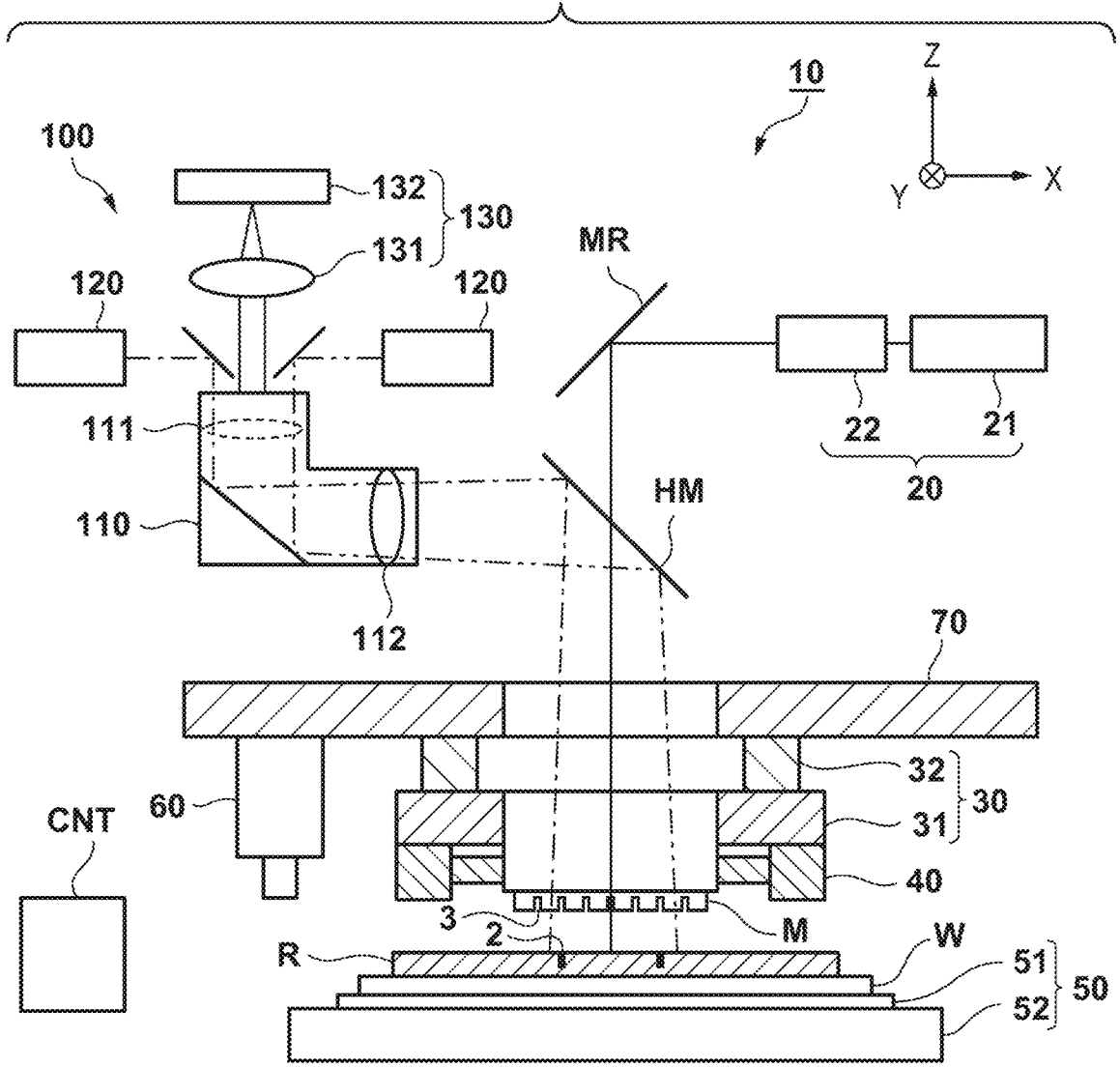
FIG. 1 is a schematic view showing an example of the arrangement of an imprint apparatus.

Exemplary embodiments of the present invention will be described below with reference to the accompanying drawings. Note that the same reference numerals denote the same members throughout the drawings, and a repetitive description thereof will not be given.

In the following embodiments, an example in which a detection apparatus according to the present invention is applied to an imprint apparatus configured to form the pattern of an imprint material on a substrate using a mold (original) will be described. However, the present invention is not limited to this. For example, the detection apparatus according to the present invention can be applied to a lithography apparatus such as an exposure apparatus configured to expose a substrate and transfer the pattern of a mask (original) onto the substrate or a drawing apparatus (electron beam exposure apparatus) configured to irradiate a substrate with a charged particle beam and form a pattern on the substrate.

<First Embodiment>

An imprint apparatus 10 according to the first embodiment of the present invention will be described. The imprint apparatus is an apparatus that brings an imprint material (an uncured material) supplied onto a substrate into contact with a mold and gives energy for curing to the imprint material, thereby forming the pattern of a cured product to which the uneven pattern of the mold is transferred. For example, the imprint apparatus 10 according to this embodiment supplies an imprint material R onto a substrate, and cures the imprint material R in a state in which a mold M (original) with an uneven pattern is in contact with the imprint material R on the substrate. Then, the interval between the mold M and a substrate W is increased to separate the mold M from the cured imprint material R, thereby forming the pattern of the imprint material R on the substrate. In some cases, the series of processes performed by the imprint apparatus 10 is generally called "imprint processing".

As the imprint material, a curable composition (to be also referred to as a resin in an uncured state) to be cured by energy for curing is used. As the energy for curing, an electromagnetic wave, heat, or the like is used. The electromagnetic wave is, for example, light such as infrared rays, visible light, or UV rays whose wavelength is selected from the range of 10 nm to 1 mm.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (viscosity at 25° C.) of the imprint material is, for example, 1 mPa·s to 100 mPa·s.

[Arrangement of Imprint Apparatus]

FIG. 1 is a schematic view showing an example of the arrangement of the imprint apparatus 10. The imprint apparatus 10 can include, for example, a curing unit 20, a mold holding unit 30, a mold correction unit 40, a substrate holding unit 50, a supply unit 60, a detection unit 100, and a control unit CNT. The control unit CNT is formed by a computer including, for example, a CPU, a memory, and the like and controls imprint processing (controls each unit of the imprint apparatus 10). In addition, the imprint apparatus 10 also includes a bridge base 70 configured to support the mold holding unit 30, a base (not shown) configured to movably support the substrate holding unit 50, and the like. Here, in FIG. 1, two axes different from each other (for example, two axes orthogonal to each other) in a plane parallel to the surface of the substrate W are defined as an X-axis and a Y-axis, respectively, and an axis perpendicular to the X-axis and the Y-axis is defined as a Z-axis.

The mold M is, for example, a mold on which an uneven pattern such as the circuit pattern of a device is three-dimensionally formed, and is manufactured using a material such as quartz capable of passing UV light. In addition, as the substrate W, glass, ceramic, a metal, a semiconductor, a resin, or the like is used. A member made of a material different from that of the substrate may be formed on the surface of the substrate W. More specifically, the substrate W is a silicon wafer, a semiconductor compound wafer, silica glass, or the like. In addition, an adhesion layer may be provided to improve the adhesion between the imprint material and the substrate, as needed, before supply of the imprint material.

The curing unit 20 irradiates the imprint material R (a resin or a resist) on the substrate with light (for example, UV light) via the mold M, thereby curing the imprint material R. In this embodiment, the imprint material R is a UV curing resin having a property of being cured by irradiation of UV light. The curing unit 20 includes, for example, a light source unit 21 and an optical system 22. The light source unit 21 can include, for example, a light source such as a mercury lamp that emits during light (for example, i-line or g-line) used to cure the imprint material R, and an ellipse mirror that condenses the curing light emitted by the light source. The optical system 22 can include a lens configured to shape the curing light such that the imprint material R on a shot region is irradiated with the curing light emitted by the light source unit 21, an aperture, and the like. The aperture can be used to control the angle of view to irradiate only the shot region (target shot region S) as the target of imprint processing with the curing light or control peripheral light shielding to limit irradiation of the outer side of the shot region of the substrate W with the curing light. The optical system 22 may include an optical integrator configured to evenly illuminate the mold M. The light emitted from the optical system 22 is reflected by a mirror MR and is incident on the imprint material R on the substrate via a half mirror HM and the mold M.

The mold holding unit 30 is also called an imprint head and can include, for example, a mold chuck 31 that holds the mold M, and a mold driving unit 32 that drives the mold chuck 31, thereby driving the mold M. The mold holding unit 30 includes a positioning mechanism that controls the position of the mold M concerning six axes, and a mechanism that presses the mold M against the substrate W or the imprint material R on it or separates the mold M from the cured imprint material R. Here, the six axes can include not only the X-axis, the Y-axis, and the Z-axis but also rotations about these axes.

The mold correction unit 40 is provided on, for example, the mold holding unit 30 and can correct the shape of the mold M by pressurizing the mold M from the peripheral direction using actuators such as cylinders acting by a fluid such as air or oil. In addition, the mold correction unit 40 may include, for example, a temperature control mechanism that controls the temperature of the mold M and correct the shape of the mold M by controlling the temperature of the mold M. The substrate W can deform (typically expand or contract) via a process such as a heat treatment. The mold correction unit 40 can correct the shape of the mold M in accordance with the deformation of the substrate W such that the overlay error between the pattern of the mold M and an existing pattern on the substrate falls within an allowable range. FIG. 2 is a view showing an example of the arrangement of the mold correction unit 40 viewed from the −Z direction. In the mold correction unit 40 shown in FIG. 2, five actuators 41 are provided in correspondence with each side of the mold M. When the actuators 41 apply a force to the side surfaces of the mold M, the mold M can be corrected into a desired shape.

The substrate holding unit 50 is also called a substrate stage and can be configured to be movable while holding the substrate W. The substrate holding unit 50 can include, for example, a substrate chuck 51 that chucks the substrate W, and a substrate driving unit 52 that drives the substrate chuck 51, thereby driving the substrate W. The substrate driving unit 52 can include a positioning mechanism that controls the position of the substrate W concerning the above-described six axes, thereby controlling the position of the substrate W.

The supply unit 60 supplies (dispenses) the imprint material R onto the substrate. The supply unit 60 can include, for example, a tank that stores the imprint material R, a plurality of orifices that discharge the imprint material R supplied from the tank via a supply path onto the substrate W, a piezoelectric element provided in the supply path communicating with the orifices, and a supply amount control unit. The supply amount control unit, for example, adjusts a signal value to be supplied to the piezoelectric element, thereby controlling the amount of the imprint material R to be discharged as a droplet from one orifice.

The detection unit 100 (scope) includes, for example, a field of view capable of including the entire target shot region S of the substrate W and captures an image of the entire target shot region S via the mold M. Then, for each of a plurality of substrate-side marks 2 provided on the target shot region S, the detection unit 100 detects the relative positions of the substrate-side mark 2 and a mold-side mark 3 based on the image obtained by the image capturing. The detection unit 100 can include, for example, an optical system 110 including a pupil plane 111 having a relationship of Fourier transformation (conjugate relationship) with the surface of the substrate W, an illumination unit 120 that illuminates the substrate W via the optical system 110, and an image capturing device 130 that captures the image of the target shot region S via the optical system 110.

In the detection unit 100 according to this embodiment, a plurality of illumination units 120 are provided. Illumination light from each illumination unit 120 is Fourier-transformed by a Fourier transformation lens 112 (objective lens) of the optical system 110 having a focal length F and illuminates the substrate W. The optical system 110 can include other lenses, apertures, and mirrors in addition to the Fourier transformation lens 112. In addition, the image capturing device 130 includes, for example, an imaging optical system 131 and an image sensor 132. The image sensor 132 include a plurality of pixels that are arranged so as to be able to capture a whole image of at least one shot region S on the substrate W via the imaging optical system 131. As the image sensor 132, for example, a CMOS sensor, a CCD sensor, a line sensor, or the like is used.

[Arrangement of Detection Unit]

In the thus configured imprint apparatus 10, for each of the plurality of substrate-side marks 2 provided at positions different from each other on the target shot region of the substrate W, the relative positions of the substrate-side mark 2 and the mold-side mark 3 are detected by the detection unit 100. Then, alignment between the mold M and the substrate W (target shot region S) is performed based on the detection result (an image obtained by the image capturing device 130) of the relative position for each of the plurality of substrate-side marks 2. In this alignment, to accurately detect the relative position for each of the plurality of substrate-side marks 2, it is preferable to efficiently use the illumination light from the illumination unit 120 and improve the illuminance of each substrate-side mark 2. That is, it is preferable to selectively illuminate only each substrate-side mark 2 (each mold-side mark 3) and improve the illuminance of each substrate-side mark 2, instead of illuminating the whole target shot region S. Hence, in the detection unit 100 according to this embodiment, the illumination unit 120 is configured such that each of the plurality of substrate-side marks 2 on the target shot region can selectively be illuminated. The detailed arrangement of the detection unit 100 according to this embodiment will be described below.

An example of the arrangement of the substrate-side mark 2 and the mold-side mark 3 will be described first. FIG. 3 is a view showing a part 4 of the image of the target shot region S obtained by image capturing by the image capturing device 130 of the detection unit 100. The substrate-side mark 2 and the mold-side mark 3, which overlap each other, are shown in the part 4 of the image. As shown in FIG. 3, each substrate-side mark 2 can include a first mark (X detection mark 2x) used to detect the position in the first direction (for example, the X direction) and a second mark (Y detection mark 2y) used to detect the position in the second direction (for example, the Y direction) different from the first direction. In the example shown in FIG. 3, each of the X detection mark 2x and the Y detection mark 2y of the substrate-side mark 2 includes a grating pattern in a checkerboard shape having a grating pitch P1 in the X direction and a grating pitch P2 in the Y direction.

On the other hand, each mold-side mark 3 can also include an X detection mark 3x and a Y detection mark 3y corresponding to each substrate-side mark 2. In the example shown in FIG. 3, the X detection mark 3x of the mold-side mark 3 includes a grating pattern having a grating pitch P3 different from the grating pitch P1 of the substrate-side mark 2 in the X direction. In addition, the Y detection mark 3y of the mold-side mark 3 includes a grating pattern having a grating pitch P4 different from the grating pitch P2 of the substrate-side mark 2 in the Y direction. When the substrate-side mark 2 and the mold-side mark 3, which are configured in the above-described way, overlap, diffracted light components from these marks (grating patterns) interfere to generate an interference fringe (moiré fringe), as shown in FIG. 4.

The arrangement of the detection unit 100 according to this embodiment will be described next. The detection unit 100 captures, by the image capturing device 130, the image of an interference fringe generated when the X detection mark 2x on the substrate and the X detection mark 3x on the mold overlap, and detects, from the captured image, the relative positions of the substrate-side mark 2 and the mold-side mark 3 in the X direction. Similarly, the detection unit 100 captures, by the image capturing device 130, the image of an interference fringe generated when the Y detection mark 2y on the substrate and the Y detection mark 3y on the mold overlap, and detects, from the captured image, the relative positions of the substrate-side mark 2 and the mold-side mark 3 in the Y direction.

Figure 5:
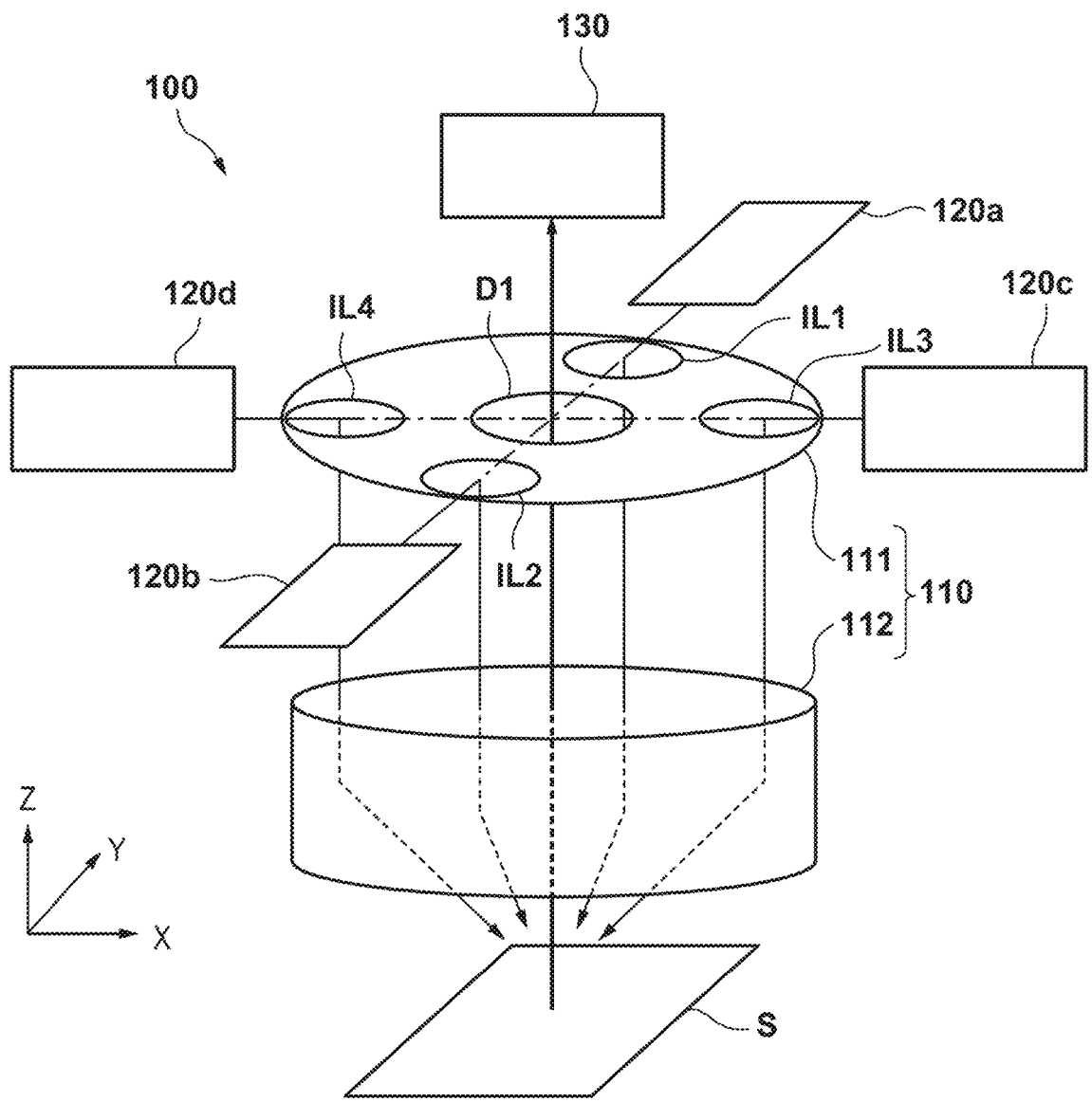
FIG. 5 is a schematic view showing an example of the arrangement of a detection unit.

FIG. 5 is a schematic view showing an example of the arrangement of the detection unit 100 according to this embodiment. The image capturing device 130 captures, through a detection opening D1 in the pupil plane 111 of the optical system 110, the image of the entire target shot region S of the substrate W, that is, the image of the plurality of substrate-side marks 2 provided on the target shot region S via the mold M (the plurality of mold-side marks 3) at once, (simultaneously). That is, the image capturing device 130 is commonly provided for the plurality of illumination units 120, and configured to be able to acquire, by one image capturing, the images (interference fringes) of the plurality of substrate-side marks 2 and the plurality of mold-side marks 3, which are selectively illuminated by the plurality of illumination units 120. The detection opening D1 can be a region different from regions in which poles IL are formed by the illumination units 120, as will be described later, in the pupil plane 111 of the optical system 110. Note that to make the drawing easy to understand, the mold M and the like are not illustrated in FIG. 5.

Each of the plurality of illumination units 120 selectively illuminates the plurality of substrate-side marks 2 provided on the target shot region S. For example, the plurality of illumination units 120 can include a first illumination unit configured to selectively illuminate the plurality of substrate-side marks 2 on the target shot region S with a plurality of first light beams, and a second illumination unit configured to selectively illuminate the plurality of substrate-side marks 2 on the target shot region S with a plurality of second light beams. The first illumination unit and the second illumination unit can be configured to selectively illuminate the same substrate-side marks 2. In this case, for example, the second illumination unit can be configured to illuminate a plurality of substrate-side marks 2 (a plurality of X detection marks 2x or a plurality of Y detection marks 2y) selectively illuminated by the first illumination unit. Alternatively, the first illumination unit and the second illumination unit may be configured to selectively illuminate the substrate-side marks 2 different from each other. In this case, for example, the first illumination unit can be configured to selectively illuminate one group of the plurality of X detection marks 2x and the plurality of Y detection marks 2y, and the second illumination unit can be configured to selectively illuminate the other group. In the example shown in FIG. 5, four illumination units 120a to 120d are provided. One of the illumination units 120a to 120d corresponds to the first illumination unit, and another one of the illumination units 120a to 120d corresponds to the second illumination unit.

The arrangement of each of the four illumination units 120a to 120d shown in FIG. 5 will be described below. The illumination units 120a and 120b are configured to selectively illuminate the plurality of X detection marks 2x on the target shot region S, and the illumination units 120c and 120d are configured to selectively illuminate the plurality of Y detection marks 2y on the target shot region S. Here, four illumination units 120 are provided in the example shown in FIG. 5. However, the number of illumination units 120 is not limed to four, and may be one or may be two or more.

The illumination unit 120a selectively illuminates the plurality of X detection marks 2x with a plurality of light beams such that each of the plurality of X detection marks 2x on the target shot region S is illuminated with at least one light beam. The illumination unit 120a can form a first pole IL1 on the pupil plane 111 of the optical system 110 by the plurality of light beams used to illuminate the plurality of X detection marks 2x. In addition, the illumination unit 120b selectively illuminates the plurality of X detection marks 2x with a plurality of light beams in a manner superimposed on the illumination of the illumination unit 120a such that each of the plurality of X detection marks 2x on the target shot region S is illuminated with at least one light beam. The illumination unit 120b can form a second pole IL2 on the pupil plane 111 of the optical system 110 by the plurality of light beams used to illuminate the plurality of X detection marks 2x. Here, in a case in which each X detection mark 2x is formed by a grating pattern in which a plurality of pattern elements are arranged in the X direction, the illumination unit 120a and 120b are configured to be formed (arranged) so as to illuminate the X detection marks 2x with the light beams (illumination light) from a direction (azimuth) perpendicular to the X direction.

The illumination unit 120c selectively illuminates the plurality of Y detection marks 2y with a plurality of light beams such that each of the plurality of Y detection marks 2y on the target shot region S is illuminated with at least one light beam. The illumination unit 120c can form a third pole IL3 on the pupil plane 111 of the optical system 110 by the plurality of light beams used to illuminate the plurality of Y detection marks 2y. In addition, the illumination unit 120d selectively illuminates the plurality of Y detection marks 2y with a plurality of light beams in a manner superimposed on the illumination of the illumination unit 120c such that each of the plurality of Y detection marks 2y on the target shot region S is illuminated with at least one light beam. The illumination unit 120d can form a fourth pole IL4 on the pupil plane 111 of the optical system 110 by the plurality of light beams used to illuminate the plurality of Y detection marks 2y. Here, in a case in which each Y detection mark 2y is formed by a grating pattern in which a plurality of pattern elements are arranged in the Y direction, the illumination unit 120c and 120d are configured to be formed (arranged) so as to illuminate the Y detection marks 2y with the light beams (illumination light) from a direction (azimuth) perpendicular to the Y direction.

[Arrangement of Each Illumination Unit]

The arrangement of each illumination unit 120 capable of selectively illuminating the plurality of substrate-side marks 2 will be described next. Each illumination unit 120 includes a change unit 121 configured to individually change the incident angle θ of each of the plurality of light beams on the pupil plane 111 (pole IL) of the optical system 110. The change unit 121 changes the incident angle θ of each light beam on the pupil plane, thereby changing the irradiated position of each light beam on the substrate. For example, when the illumination unit 120c makes a light beam incident on the pupil plane 111 (pole IL3) at the incident angle θ, a position on the substrate having coordinates represented by F×sin θ can be irradiated with the light beam ("F" is the focal length of the Fourier transformation lens 112). Hence, the control unit CNT decides the incident angle θ of each light beam on the pupil plane 111 (pole IL3) based on the designed position (target irradiated position) of each substrate-side mark 2 on the target shot region S, and controls the change unit 121 such that each light beam is incident on the pupil plane 111 at the decided incident angle θ. Accordingly, the illumination unit 120c can selectively illuminate the plurality of substrate-side marks 2 such that each of the plurality of substrate-side marks 2 on the target shot region is illuminated with at least one light beam from the illumination unit 120c. Here, the control unit CNT may obtain, in advance, information representing the correspondence relationship between the incident angle θ of the light beam on the pupil plane 111 and the position (coordinates) on the substrate irradiated with the light beam and control the change unit 121 based on the information.

Figure 6:
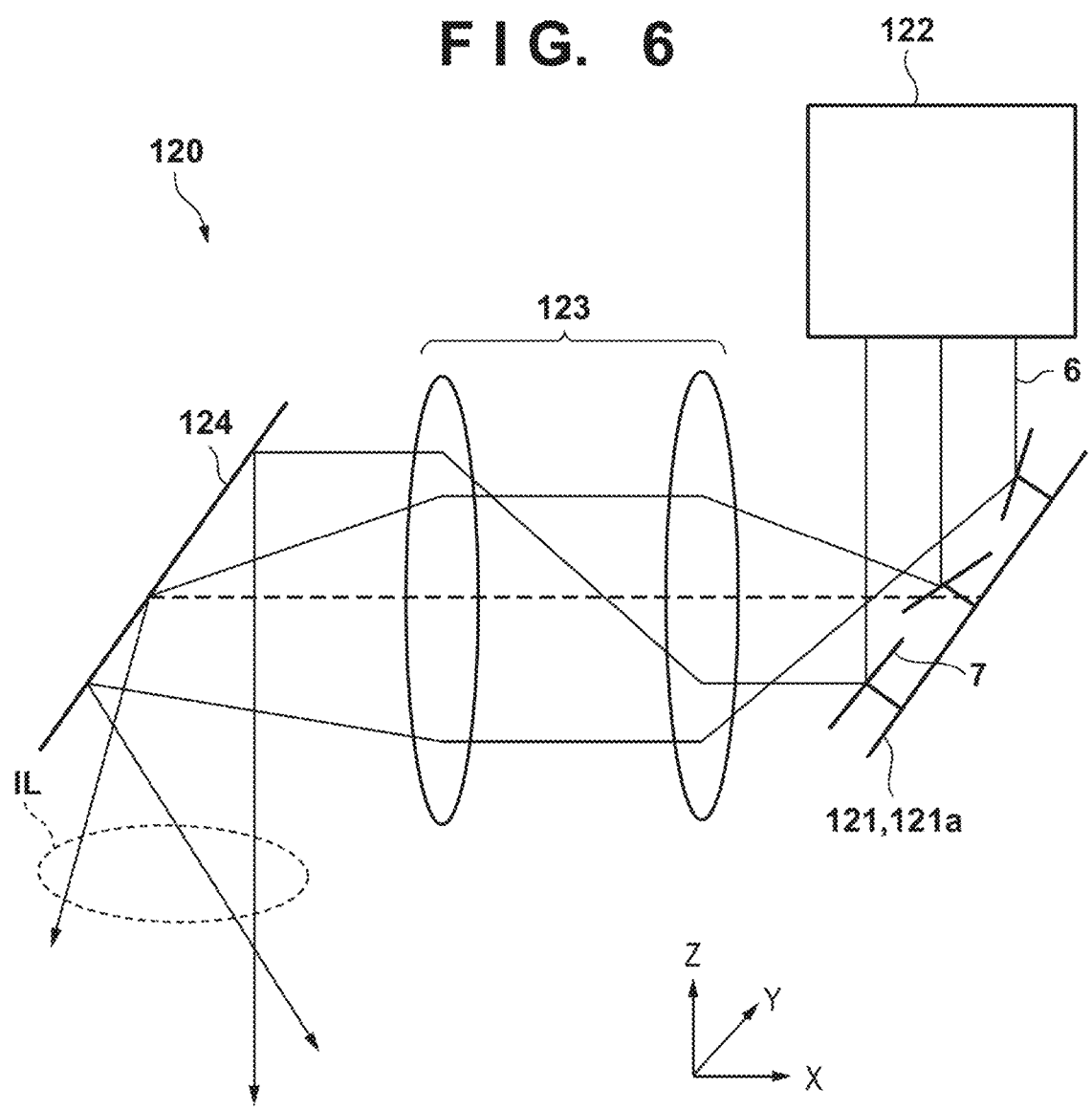
FIG. 6 is a schematic view showing an example of the arrangement of an illumination unit.

FIG. 6 is a schematic view showing an example of the arrangement of the illumination unit 120. The illumination unit 120 shown in FIG. 6 can include a light source unit 122 that emits a plurality of light beams 6, an optical system 123 including a lens and the like, and a mirror 124 that reflects the plurality of light beams 6 emitted from the optical system 123 toward the pupil plane (pole IL). In the illumination unit 120 shown in FIG. 6, a mirror array 121a including a plurality of mirrors 7 configured to respectively reflect the plurality of light beams 6 emitted by the light source unit 122 and guide them to the optical system is provided as the change unit 121. The mirror array 121a is, for example, a MEMS mirror array (digital micro mirror device) capable of two-axis driving and is configured to be able to adjust the reflection directions of the plurality of light beams 6 emitted by the light source unit 122. The change unit 121 can individually change the incident angle θ of each light beam 6 that is emitted from the optical system 123 and is incident on the pupil plane 111 (pole IL) by individually adjusting, by the plurality of mirrors 7, the reflection directions of the plurality of light beams 6 emitted by the light source unit 122. Note that although three light beams are shown in FIG. 6, the number of light beams is not limited to three.

Figure 7:
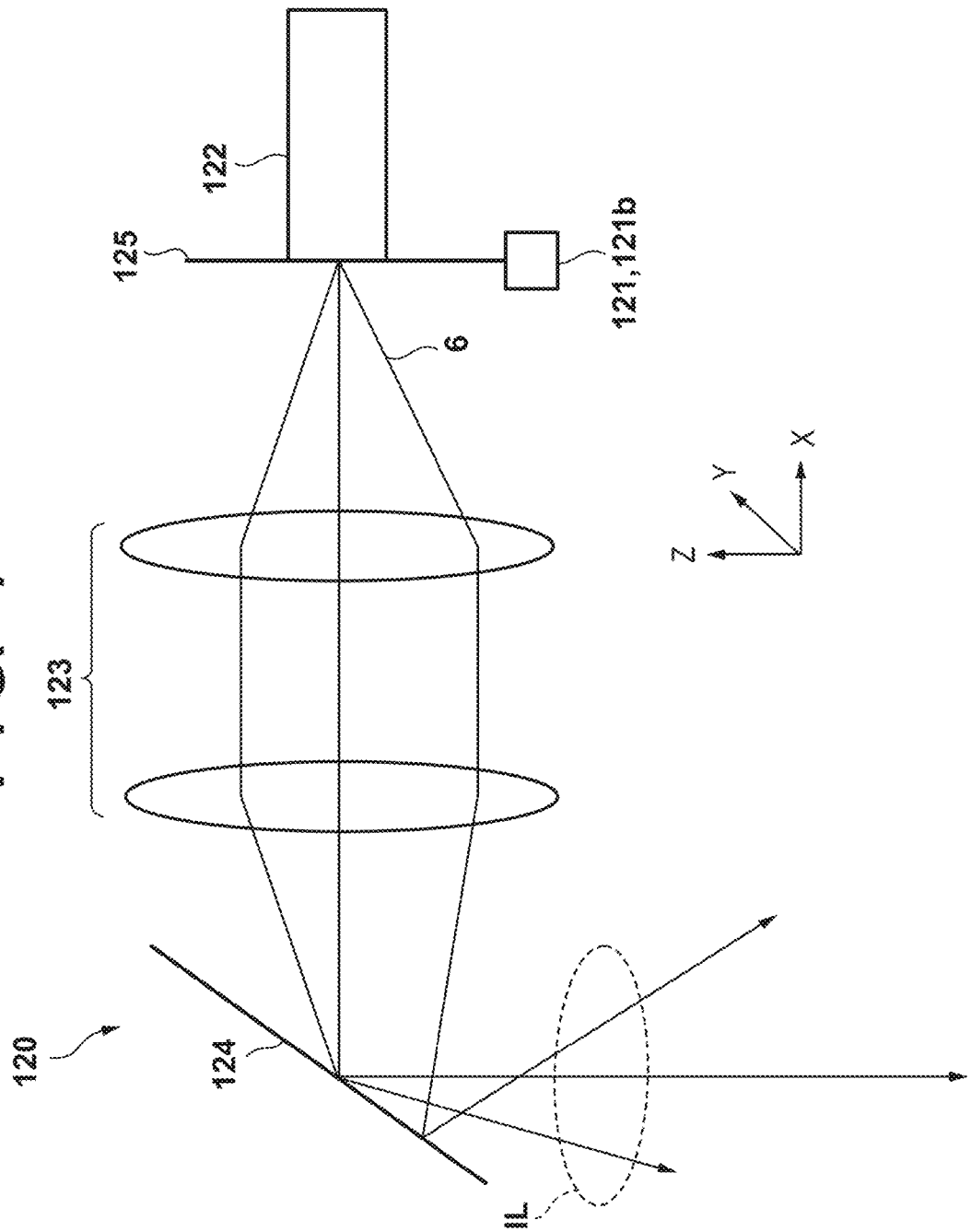
FIG. 7 is a schematic view showing another example of the arrangement of the illumination unit.

FIG. 7 is a schematic view showing another example of the arrangement of the illumination unit 120. The illumination unit 120 shown in FIG. 7 can include the light source unit 122 that emits the light beam 6, a diffractive element 125 that diffracts the light beam 6 emitted by the light source unit 122 to generate a plurality of light beams 6, and the optical system 123 including a lens and the like configured to condense the plurality of light beams 6 generated by the diffractive element 125. In addition, the illumination unit 120 can include the mirror 124 that reflects the plurality of light beams 6 emitted from the optical system 123 toward the pupil plane 111 (pole IL). In the illumination unit 120 shown in FIG. 7, a driving unit 121b that relatively drives the diffractive element 125 and the optical system 123 (lens) to change their relative positions is provided as the change unit 121. The driving unit 121b can individually change the incident angle θ of each light beam 6 on the pupil plane 111 (pole IL) by relatively driving the diffractive element 125 and the optical system 123 (lens) and adjusting the position at which each light beam 6 generated by the diffractive element 125 is incident on the optical system 123.

Here, in a case in which the positions (the intervals or the like) of the plurality of substrate-side marks 2 on the substrate change, the diffractive element 125 may be exchanged to correspond to the positions of the plurality of substrate-side marks 2. In addition, as the diffractive element 125, at least one of a diffraction optical element including a diffraction grating, an acoustic optical modulator, and a spatial light phase modulator can be used. The spatial light phase modulator is an element capable of spatially modulating the phase of light by an electrical signal and freely changing the diffraction distribution.

Figure 8:
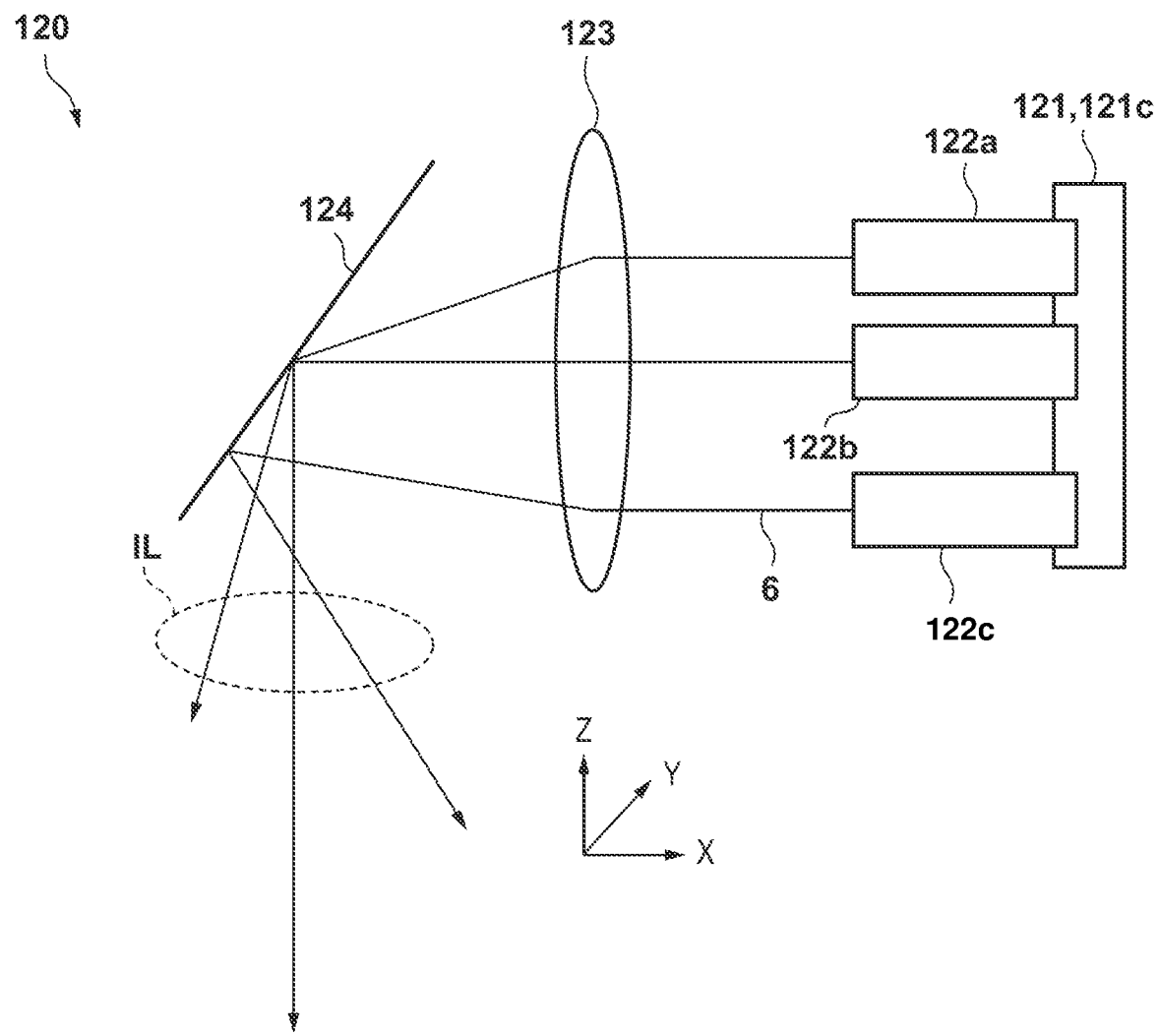
FIG. 8 is a schematic view showing still another example of the arrangement of the illumination unit.

FIG. 8 is a schematic view showing still another example of the arrangement of the illumination unit 120. The illumination unit 120 shown in FIG. 8 can include a plurality of light source units 122a to 122c each configured to emit the light beam 6, the optical system 123 including a lens and the like, and the mirror 124 that reflects the plurality of light beams 6 emitted from the optical system 123 toward the pupil plane (pole IL). In the illumination unit 120 shown in FIG. 8, a driving unit 121c that drives each of the plurality of light source units 122a to 122c is provided as the change unit 121. The driving unit 121c can individually change the incident angle θ of each light beam 6 on the pupil plane 111 (pole IL) by driving each of the plurality of light source units 122a to 122c and individually adjusting the position at which the light beam 6 emitted by each light source unit is incident on the optical system 123.

Figure 9:
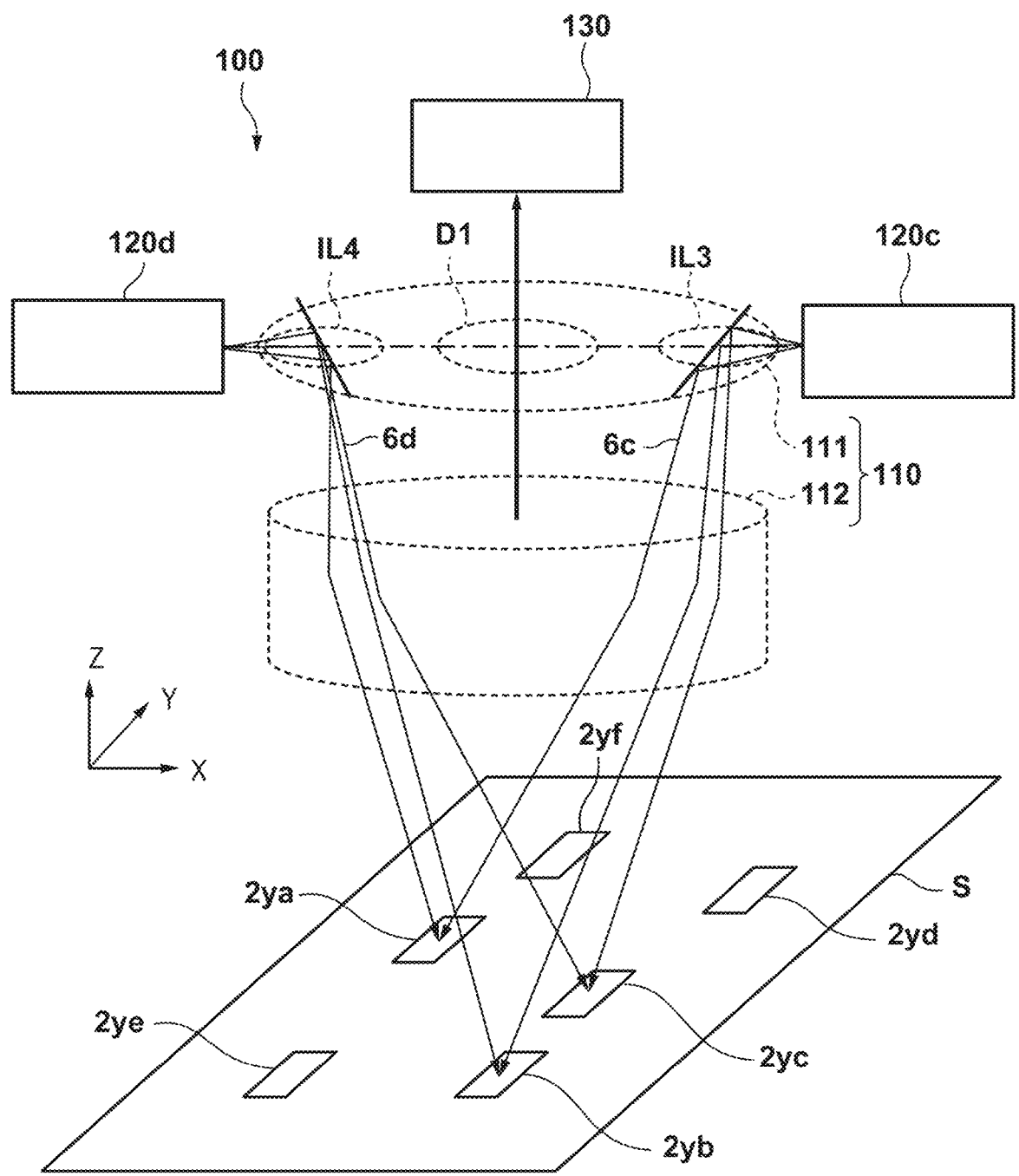
FIG. 9 is a view showing an example in which a plurality of substrate-side marks are selectively illuminated.

An example in which the plurality of illumination units 120 configured in the above-described way selectively illuminate the plurality of substrate-side marks 2 (Y detection marks 2y) on the target shot region will be described next. FIG. 9 is a view showing an example in which the illumination units 120c and 120d selectively illuminate the plurality of substrate-side marks 2 (Y detection marks 2y) on the target shot region S. FIG. 9 shows an example in which each of the illumination units 120c and 120d selectively illuminates Y detection marks 2ya to 2yc in a plurality of Y detection marks 2ya to 2yf on the target shot region S. The Y detection marks 2yd to 2yf are spare marks. To make the drawing easy to understand, the illumination units 120a and 120b used to illuminate the X detection marks 2x are not illustrated in FIG. 9. In the illumination units 120a and 120b as well, the same control as the control of the illumination units 120c and 120d can be performed.

In the illumination unit 120c, the control unit CNT controls the change unit 121 to adjust the incident angle θ of each light beam 6c on the pupil plane 111 (pole IL3) and make the light beams 6c incident on the Y detection marks 2ya to 2yc. More specifically, when the incident angle θ of each light beam 6c on the pole IL3 is changed on the X-Z plane, the position on the substrate irradiated with the light beam 6c can be changed in the X direction. In addition, when the incident angle θ of each light beam 6c on the pole IL3 is changed on the Y-Z plane, the position on the substrate irradiated with the light beam 6c can be changed in the Y direction. Similarly, in the illumination unit 120d, the control unit CNT controls the change unit 121 to adjust the incident angle θ of each light beam 6d on the pupil plane 111 (pole IL4) and make the light beams 6c incident on the Y detection marks 2ya to 2yc.

In this way, when the illumination units 120c and 120d selectively illuminate the Y detection marks 2ya to 2yc on the same substrate, the illuminance can be increase in the Y detection marks 2ya to 2yc. For this reason, the detection unit 100 can accurately detect the Y detection marks 2ya to 2yc from an image obtained by the image capturing device 130.

Figure 10:
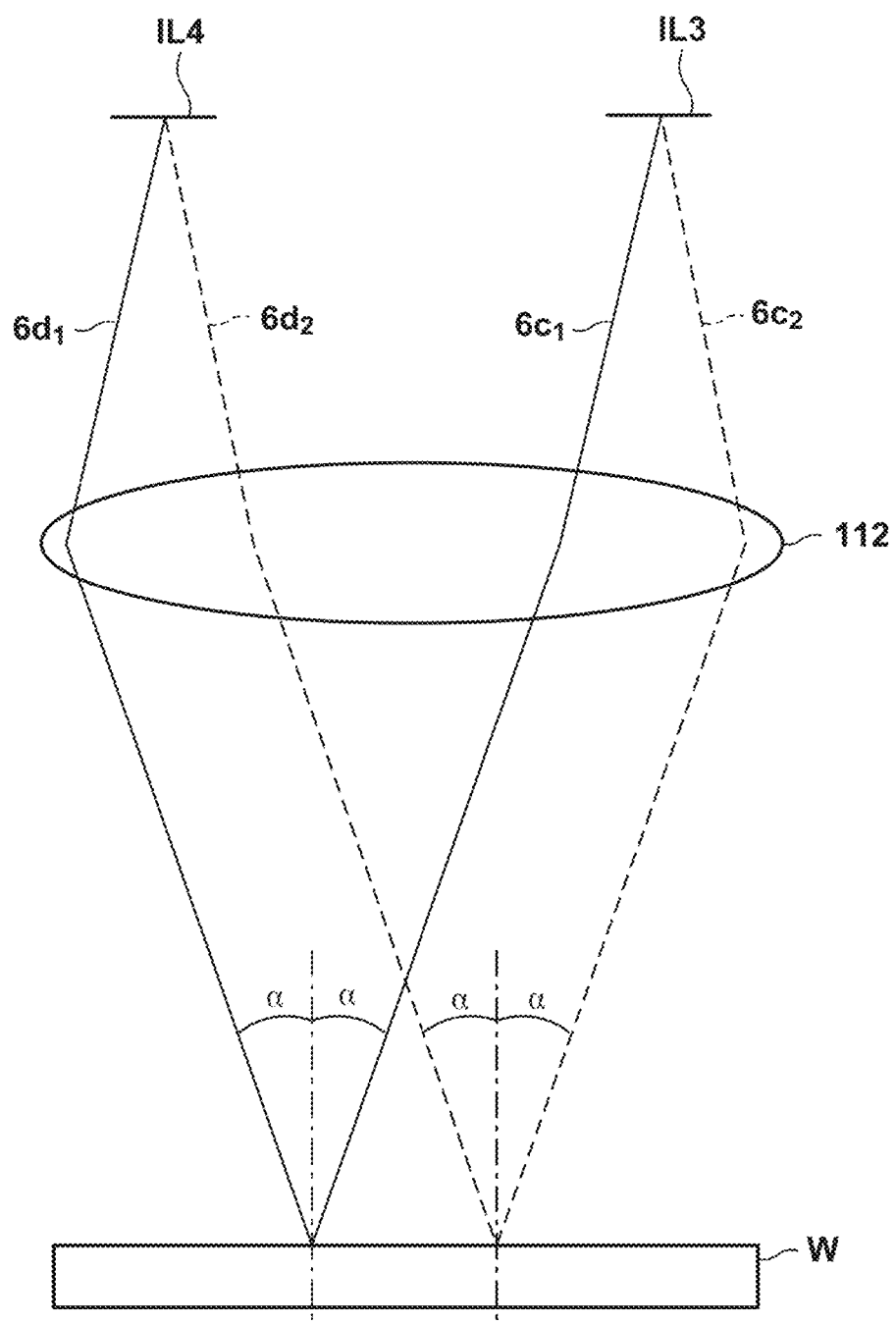
FIG. 10 is a view for explaining the effect of the present invention.

Additionally, since the pupil plane 111 of the optical system 110 is the Fourier transformation plane of the surface of the substrate W (the surface of the mold M), the irradiation angle α of a light beam on the substrate can be made constant even when the irradiated position of the light beam on the substrate is changed by changing the incident angle θ of the light beam on the pupil plane 111. For example, as shown in FIG. 10, when light beams $6c_1$ and $6c_2$ are made incident on the pole IL3 of the pupil plane 11 at the incident angles θ different from each other, positions different from each other on the substrate can be irradiated at the same irradiation angle α (incident angle). In addition, when light beams $6d_1$ and $6d_2$ are made incident on the pole IL4 of the pupil plane 111 at the incident angles θ different from each other, positions different from each other on the substrate can be irradiated at the same irradiation angle α (incident angle). That is, the plurality of substrate-side marks 2 arranged at positions different from each other on the substrate can be irradiated with the light beams from the plurality of illumination units 120 at the same irradiation angle α to perform uniform illumination.

Here, if the plurality of X detection marks 2x and the plurality of Y detection marks 2y are simultaneously illuminated by the illumination units 120a to 120d and captured, unwanted light is generated, and it may be difficult to accurately detect the relative positions of the substrate-side mark 2 and the mold-side mark 3. Hence, the control unit CNT may control the image capturing device 130 to capture the images of the plurality of X detection marks 2x and the plurality of Y detection marks 2y at timings different from each other. For example, when causing the image capturing device 130 to capture the image of the plurality of X detection marks 2x, the control unit CNT controls the illumination units 120a and 120b to selectively illuminate the plurality of X detection marks 2x. At this time, illumination of the plurality of Y detection marks 2y by the illumination units 120c and 120d is not performed. On the other hand, when causing the image capturing device 130 to capture the image of the plurality of Y detection marks 2y, the control unit CNT controls the illumination units 120c and 120d to selectively illuminate the plurality of Y detection marks 2y. At this time, illumination of the plurality of X detection marks 2x by the illumination units 120a and 120b is not performed. This control makes it possible to reduce generation of unwanted light and accurately detect the relative positions of the substrate-side mark 2 and the mold-side mark 3.

<Second Embodiment>

An imprint apparatus according to the second embodiment of the present invention will be described. The imprint apparatus according to the second embodiment basically takes over the imprint apparatus 10 according to the first embodiment. However, arrangement of a detection unit 100, more specifically, the arrangement of an image capturing device 130 can be different from the first embodiment.

FIG. 11 is a schematic view showing an example of the arrangement of the image capturing device 130 according to this embodiment. In this embodiment, the detection unit includes a plurality of image capturing devices 130 each including an imaging optical system 131 and an image sensor 132, and a division unit 133. The image of a target shot region S is divisionally captured via a detection opening D1 in a pupil plane 111 of an optical system 110. As the division unit 133, for example, a mirror, a half mirror prism, a digital mirror array, or the like can be used. In the example shown in FIG. 11, a plurality of (two) image capturing devices 130a and 130b each including the imaging optical system 131 and the image sensor 132 are provided, and the division unit 133 is provided with mirrors 133a and 133b. With this arrangement, the image capturing device 130a can capture the image of a part (for example, substrate-side marks 2ye, 2ya, and 2yf in FIG. 9) of the target shot region S by an image sensor 132a via an imaging optical system 131a and the mirror 133a. In addition, the image capturing device 130b can capture the image of another part (for example, substrate-side marks 2yb, 2yc, and 2yd in FIG. 9) of the target shot region S by an image sensor 132b via an imaging optical system 131b and the mirror 133b.

In this way, when the image of the target shot region S is divisionally captured, a plurality of substrate-side marks 2 on the target shot region S can be detected more accurately. Here, the arrangement (layout) of the image capturing devices 130 used to divisionally capture the image of the target shot region S can be changed in accordance with the positions of the plurality of substrate-side marks 2 on the target shot region S.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on an imprint material supplied (dispensed) onto a substrate using the above-described imprint apparatus (imprint method), and a step of processing the substrate on which the pattern is formed in the preceding step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, the quality, the productivity, and the production cost of the article, as compared to a conventional method.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
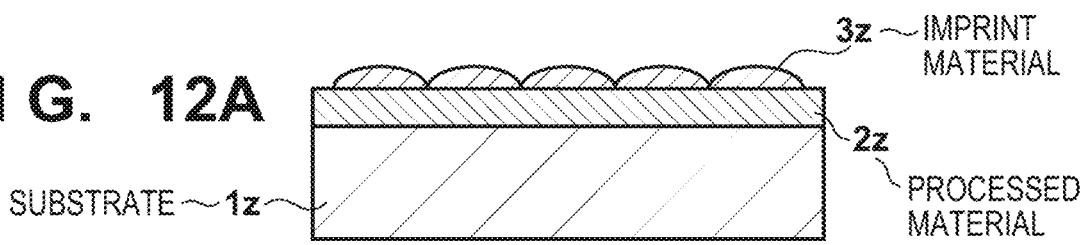
FIGS. 12A to 12F are views for explaining a method of manufacturing an article.

A detailed method of manufacturing an article will be described next. As shown in FIG. 12A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 12B:
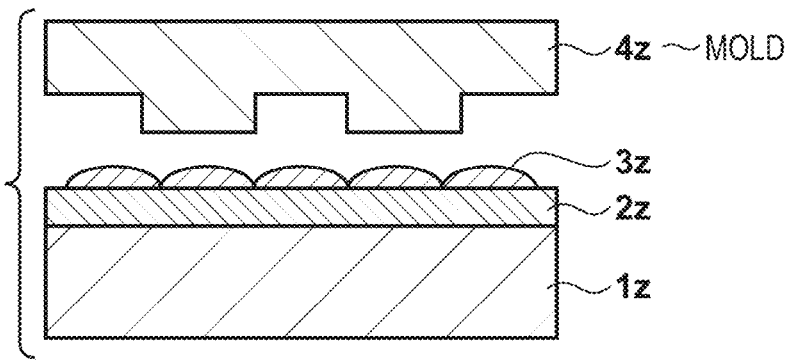
Figure 12C:
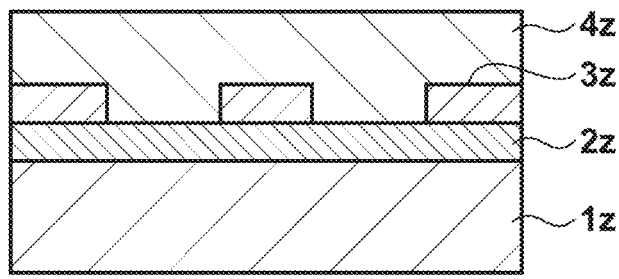

As shown in FIG. 12B, a side of a mold 4z for imprint with an uneven pattern is directed to and caused to face the imprint material 3z on the substrate. As shown in FIG. 12C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

Figure 12D:
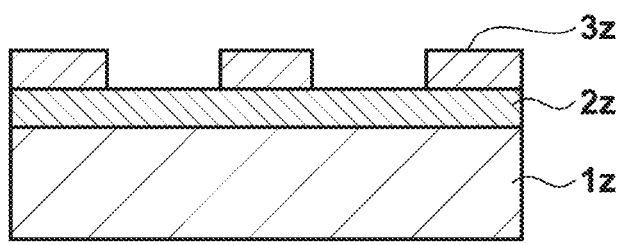

As shown in FIG. 12D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 12E:
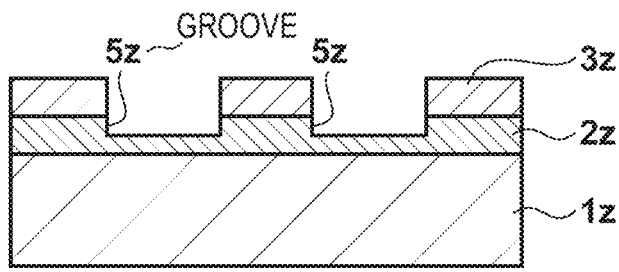
Figure 12F:
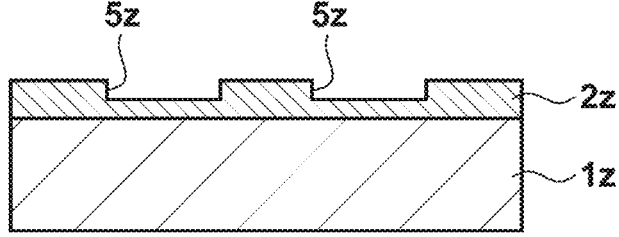

As shown in FIG. 12E, when etching is performed using the pattern of the cured product as an etching resistant mask, a portion of the surface of the processed material 2z where the cured product does not exist or remains thin is removed to form a groove 5z. As shown in FIG. 12F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

<Other Embodiments>

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-023405 filed on Feb. 13, 2018, which is hereby incorporated by reference herein in its entirety.

What is claimed is:

1. A detection apparatus for detecting a plurality of marks provided on a substrate, comprising:
an optical system;
an illumination unit configured to selectively illuminate the plurality of marks with a plurality of light beams via the optical system such that each of the plurality of marks is illuminated with at least one light beam; and
an image capturing device configured to capture images of the plurality of marks via the optical system,
wherein the illumination unit includes a change unit configured to individually change an irradiated position of each of the plurality of light beams on the substrate by individually changing an incident angle at which each of the plurality of light beams is incident on a pupil plane of the optical system, in accordance with positions of the plurality of marks on the substrate.

2. The apparatus according to claim 1, wherein the change unit includes a plurality of mirrors, and individually changes the incident angle of each of the plurality of light beams on the pupil plane by individually adjusting a reflection direction of each of the plurality of light beams by a plurality of mirrors.

3. The apparatus according to claim 1, wherein
the illumination unit further includes a plurality of light sources configured to respectively emit the plurality of light beams, and
the change unit individually changes the incident angle of each of the plurality of light beams on the pupil plane by individually driving each of the plurality of light sources.

4. The apparatus according to claim 1, wherein
the illumination unit includes a diffractive element configured to diffract a light beam emitted by a light source to generate the plurality of light beams, and a lens configured to condense the plurality of light beams generated by the diffractive element, and
the change unit individually changes the incident angle of each of the plurality of light beams on the pupil plane by changing relative positions of the diffractive element and the lens.

5. The apparatus according to claim 4, wherein the diffractive element includes at least one of a diffraction optical element including a diffraction grating, an acoustic optical modulator, and a spatial light phase modulator.

6. The apparatus according to claim 1, wherein the image capturing device captures the image of the plurality of marks at once via the optical system.

7. The apparatus according to claim 1, wherein
the illumination unit forms poles on the pupil plane by the plurality of light beams, and
the image capturing device captures the image of the plurality of marks via a region different from regions in which the poles are formed, among the pupil plane.

8. The apparatus according to claim 1, wherein the illumination unit includes a first illumination unit configured to selectively illuminate the plurality of marks with a plurality of first light beams and a second illumination unit configured to selectively illuminate the plurality of marks with a plurality of second light beams.

9. The apparatus according to claim 8, wherein the second illumination unit selectively illuminates the plurality of marks, which are selectively illuminated with the plurality of first light beams by the first illumination unit, with the plurality of second light beams.

10. The apparatus according to claim 8, wherein
the plurality of marks include a plurality of first marks used to detect a position in a first direction and a plurality of second marks used to detect a position in a second direction different from the first direction, and
the first illumination unit selectively illuminates the plurality of first marks with the plurality of first light beams, and the second illumination unit selectively illuminates the plurality of second marks with the plurality of second light beams.

11. The apparatus according to claim 10, wherein the first illumination unit selectively illuminates the plurality of first marks with the plurality of first light beams from a direction perpendicular to the first direction, and the second illumination unit selectively illuminates the plurality of second marks with the plurality of second light beams from a direction perpendicular to the second direction.

12. The apparatus according to claim 10, further comprising a control unit configured to control the image capturing device so as to capture images of the plurality of first marks and images of the plurality of second marks at timings different from each other,
wherein when causing the image capturing device to capture the image of the plurality of first marks, the control unit controls the first illumination unit to selectively illuminate the plurality of first marks, and when causing the image capturing device to capture the image of the plurality of second marks, the control unit controls the second illumination unit to selectively illuminate the plurality of second marks.

13. The apparatus according to claim 8, wherein the first illumination unit forms a first pole on the pupil plane by the plurality of first light beams, and the second illumination unit forms a second pole on the pupil plane by the plurality of second light beams.

14. The apparatus according to claim 1, wherein the image capturing device captures the images of the plurality of marks provided on the substrate via a plurality of marks provided on an original.

15. The apparatus according to claim 1, wherein
the plurality of light beams includes at least two light beams which form one pole on the pupil plane, and
the change unit individually changes the incident angle of each of the at least two light beams, so as to respectively irradiate, with the at least two light beams, marks different from each other among the plurality of marks.

16. The apparatus according to claim 1, wherein
the plurality of light beams includes first light beams which form a first pole on the pupil plane, and second light beams which form a second pole different from the first pole on the pupil plane,
the change unit individually changes the incident angle of each of the first light beams, so as to respectively irradiate, with the first light beams, marks different from each other among the plurality of marks, and
the change unit individually change the incident angle of each of the second light beams, so as to respectively irradiate, with the second light beams, the marks which are respectively irradiated with the first light beams.

17. The apparatus according to claim 1, further comprising a control unit configured to individually control the incident angle of each of the plurality of light beams by the change unit, based on information indicating positions of the plurality of marks on the substrate, such that each of the plurality of marks is illuminated with at least one light beam.

18. The apparatus according to claim 1, further comprising a control unit configured to determine the incident angle of each of the plurality of light beams based on second information indicating a relationship between the incident angle and the irradiated position for each of the plurality of light beams, and control the change unit based on the determined incident angle.

19. The apparatus according to claim 1, wherein the change unit individually changes an angle at which each of the plurality of light beams is incident on the optical system, as the incident angle.

20. A lithography apparatus for forming a pattern on a substrate, comprising:
   a stage configured to hold the substrate provided with a plurality of marks; and
   a detection apparatus configured to detect the plurality of marks,
   wherein the detection apparatus includes:
      an optical system;
      an illumination unit configured to selectively illuminate the plurality of marks with a plurality of light beams via the optical system such that each of the plurality of marks is illuminated with at least one light beam; and
      an image capturing device configured to capture images of the plurality of marks via the optical system, and
   wherein the illumination unit includes a change unit configured to individually change an irradiated position of each of the plurality of light beams on the substrate by individually changing an incident angle at which each of the plurality of light beams is incident on a pupil plane of the optical system, in accordance with positions of the plurality of marks on the substrate.

21. The lithography apparatus according to claim 20, wherein the lithography apparatus is an imprint apparatus which forms a pattern of an imprint material on the substrate.

22. A method of manufacturing an article, the method comprising:
   forming a pattern on a substrate using a lithography apparatus;
   processing the substrate, on which the pattern has been formed, to manufacture the article,
   wherein the lithography apparatus forms a pattern on a substrate, and includes:
      a stage configured to hold the substrate provided with a plurality of marks; and
      a detection apparatus configured to detect the plurality of marks,
   wherein the detection apparatus includes:
      an optical system;
      an illumination unit configured to selectively illuminate the plurality of marks with a plurality of light beams via the optical system such that each of the plurality of marks is illuminated with at least one light beam; and
      an image capturing device configured to capture images of the plurality of marks via the optical system, and
   wherein the illumination unit includes a change unit configured to individually change an irradiated position of each of the plurality of light beams on the substrate by individually changing an incident angle at which each of the plurality of light beams is incident on a pupil plane of the optical system, in accordance with positions of the plurality of marks on the substrate.

* * * * *